United States Patent
Huang et al.

(10) Patent No.: US 8,255,862 B2
(45) Date of Patent: Aug. 28, 2012

(54) SYSTEM AND METHOD FOR ANALYZING TEMPERATURE RISE OF A PRINTED CIRCUIT BOARD

(75) Inventors: Tsung-Sheng Huang, Taipei Hsien (TW); Chun-Jen Chen, Taipei Hsien (TW); Duen-Yi Ho, Taipei Hsien (TW); Wei-Chieh Chou, Taipei Hsien (TW); Hsien-Chuan Liang, Taipei Hsien (TW); Shou-Kuo Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 289 days.

(21) Appl. No.: 12/790,857

(22) Filed: May 31, 2010

(65) Prior Publication Data

US 2011/0093831 A1   Apr. 21, 2011

(30) Foreign Application Priority Data

Oct. 21, 2009 (CN) .......................... 2009 1 0308564

(51) Int. Cl.
*G06F 17/50* (2006.01)
(52) U.S. Cl. ...................................................... 716/137
(58) Field of Classification Search .................. 716/137
See application file for complete search history.

(56) References Cited

U.S. PATENT DOCUMENTS

| | | | |
|---|---|---|---|
| 7,089,129 B2* | 8/2006 | Habitz | 702/65 |
| 7,689,945 B2* | 3/2010 | Hillman et al. | 716/136 |
| 2009/0187869 A1* | 7/2009 | Jain et al. | 716/6 |
| 2010/0280778 A1* | 11/2010 | Ohta | 702/66 |
| 2011/0036624 A1* | 2/2011 | Kagimura et al. | 174/260 |

\* cited by examiner

*Primary Examiner* — Stacy Whitmore
*Assistant Examiner* — Magid Dimyan
(74) *Attorney, Agent, or Firm* — Altis Law Group, Inc.

(57) ABSTRACT

A system and method that can analyze a temperature rise of a printed circuit board (PCB). The system and method receives attribute parameters of the PCB from an input device, and generates a temperature rise formula according to the received attribute parameters. Additionally, the system and method calculates a temperature rise of a local area surrounding each component on the PCB according to the temperature rise formula.

12 Claims, 5 Drawing Sheets

SYSTEM AND METHOD FOR ANALYZING TEMPERATURE RISE OF A PRINTED CIRCUIT BOARD

BACKGROUND

1. Technical Field

Embodiments of the present disclosure relate to systems and methods for analyzing printed circuit boards (PCBs), and more particularly to a system and method for analyzing temperature rise of a PCB.

2. Description of Related Art

PCBs provide a mechanism to implement a circuit design (i.e., the interconnection of electrical devices and components) for use, for example, in a computer system. Temperature rise of a PCB may occur when current passes through various components positioned on the PCB. Analyzing the temperature rise of the PCB is critical because an excessive temperature rise may cause the PCB to become unstable and unreliable.

Therefore, there is a need for a system and method to analyze the temperature rise of a PCB before the PCB layout.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
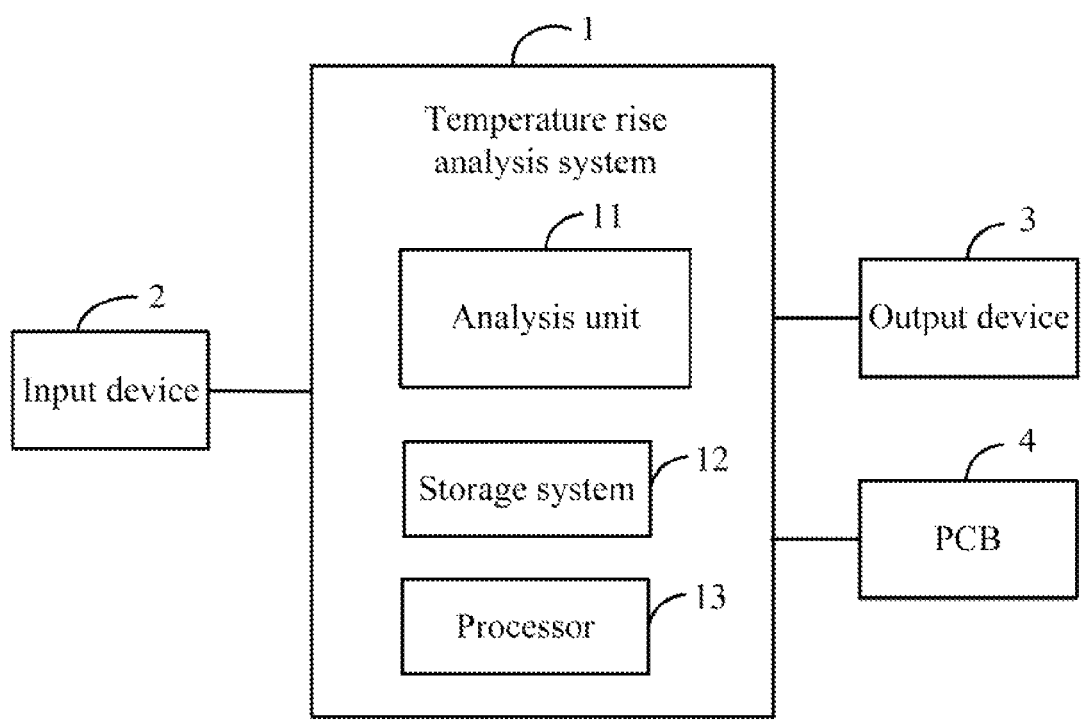
FIG. 1 is a block diagram of one embodiment of a temperature rise analysis system comprising an analysis unit.

FIG. 1 is a block diagram of one embodiment of a temperature rise analysis system 1 comprising an analysis unit 11. In the embodiment, the temperature rise analysis system 1 further includes a storage system 12 and a processor 13, and connects to at least one input device 2 and at least one output device 3 to analyze the temperature rise of a printed circuit board (PCB) 4. The input device 2 may be a keyboard or a mouse, which is used to input data during the temperature analysis process. The output device 3 may be a monitor or a printer, and is used to output analysis results.

The storage system 12 stores a plurality of programs, such as programs of an operating system, and various information of the PCB 4. In one embodiment, the storage system 12 may be random access memory (RAM) for temporary storage of information, and/or a read only memory (ROM) for permanent storage of information. In other embodiments, the storage system 12 may also be an external storage device, such as a hard disk, a storage card, or a data storage medium. The processor 13 executes a plurality of computerized operations of the temperature rise analysis system 1 and other applications, to provide functions of the temperature rise analysis system 1.

The temperature rise analysis system 11 may include a plurality of functional modules consisting of one or more computerized instructions that are stored in the storage system 12, or a computer readable medium, and executed by the processor 13. Further details of the temperature rise analysis system 11 are provided below.

Figure 2:
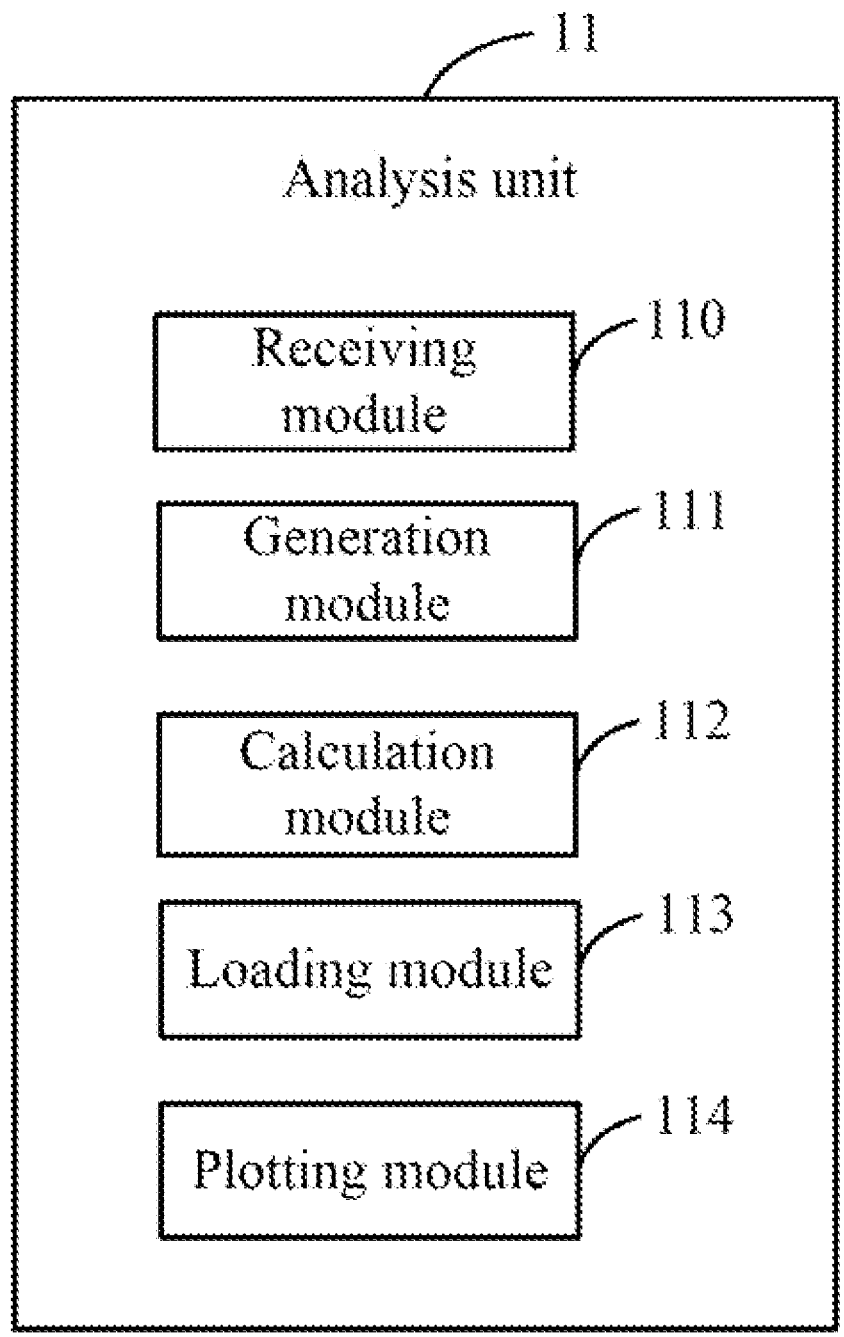
FIG. 2 is a block diagram of one embodiment of functional modules of the analysis unit in FIG. 1.

FIG. 2 is a block diagram of one embodiment of functional modules of the analysis unit 11 in FIG. 1. In one embodiment, the analysis unit 11 includes a receiving module 110, a generation module 111, a calculation module 112, a loading module 113, and a plotting module 114. In general, the word "module," as used herein, refers to logic embodied in hardware or firmware, or to a collection of software instructions, written in a programming language, such as, for example, Java, C, or Assembly. One or more software instructions in the modules may be embedded in firmware, such as EPROM. The modules described herein may be implemented as either software and/or hardware modules and may be stored in any type of computer-readable medium or other storage device.

The receiving module 110 receives the attribute parameters of the PCB 4 from the input device 2. In one embodiment, the attribute parameters may comprise a layer type of a copper foil of the PCB 4, a thickness of the copper foil, a layout width of the copper foil for a component (e.g., resistor, capacitor, integrated circuit) positioned on the PCB 4, and an amount of current passing through the component. The layer type of the copper foil denotes where the copper foil is located on the PCB 4. The layer type of the copper foil may be an internal layer or an external layer of the PCB 4. It should be understood that an internal layer copper foil may cause a greater temperature rise than an external layer copper foil under a same condition.

Figure 3:
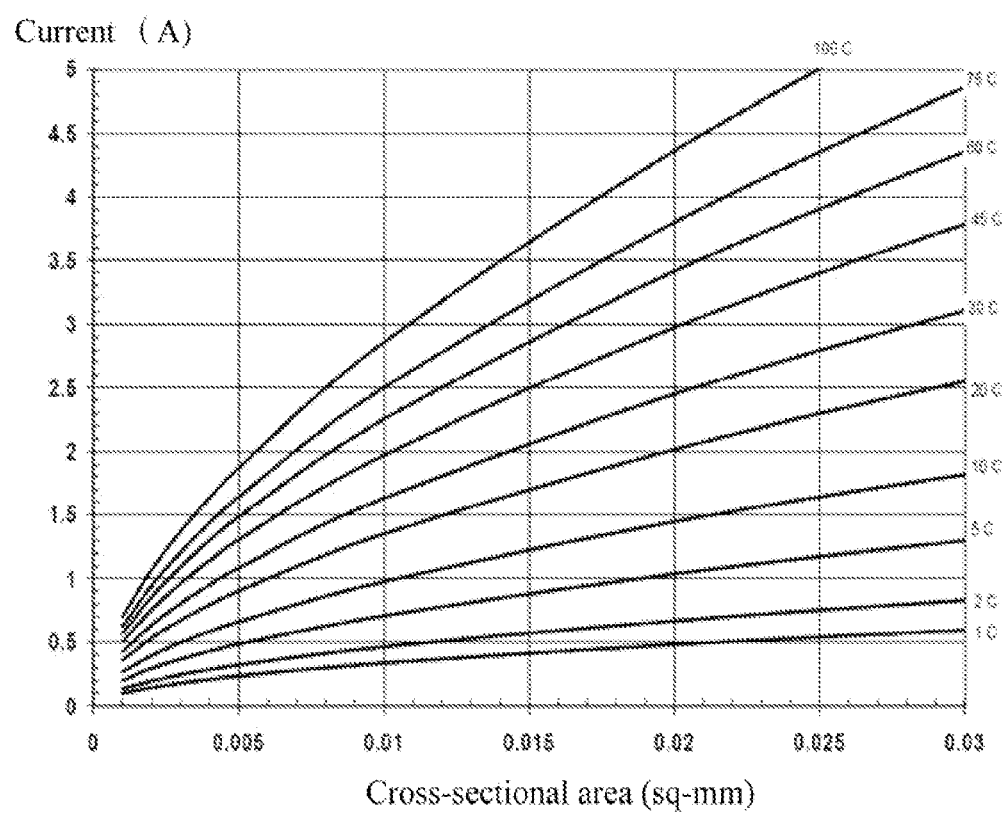
FIG. 3 is a schematic of a temperature rise curve of a PCB.

The generation module 111 is operable to generate a temperature rise formula according to the received attribute parameters. In the embodiment, the temperature rise formula is denoted as $I=a*S^{\alpha}*(\Delta T)^{\beta}$, where I is the amount of current passing through the component, S is a cross-sectional area of the copper foil which is a product of the thickness of the copper foil and the layout width of the copper foil for the component positioned on the PCB 4, $\Delta T$ is the temperature rise of the local area surrounding the component, and a, $\alpha$, and $\beta$ correspond to and are determined by the thickness of the copper foil and the layer type of the copper foil, and wherein a, $\alpha$ and $\beta$ are values stored in the storage system 12. Each copper foil having a different thickness and a different layer type corresponds to a unique temperature rise formula. In one example, a thickness of a copper foil in the PCB 4 may be 2.4 MIL, and the layer type of the copper foil may be an internal layer. One example with respect to FIG. 3, is a schematic graph illustrating a temperature rise relationship between current and a cross sectional area of the copper foil of the PCB 4. Different temperature rise curves of the PCB 4 are shown in FIG. 3. The parameters a, $\alpha$ and $\beta$ can be computed by analyzing the curves using a curve analyzer before the temperature analyzing process, and stored the parameters a, $\alpha$ and $\beta$ in the storage system 12 correspond to the layer type of the copper foil and the thickness of the copper foil. As described above, the generation module 111 searches the storage system 12 for the parameters a, $\alpha$ and $\beta$ correspond to the layer type of the copper foil and the thickness of the copper foil, and then generates the temperature rise formula according to the parameters a, $\alpha$ and $\beta$ and the attribute parameters.

The calculation module 112 calculates a temperature rise of a local area surrounding the component according to the generated temperature rise formula. As thus, the temperature rise analysis system 11 analyzes the temperature rise of the PCB 4 by calculating a temperature rise of a local area surrounding each component of the PCB 4. After the temperature rise of the local area surrounding each component of the PCB 4 is calculated, the temperature rise analysis system 11 plots a temperature rise distribution graph of the PCB 4. The temperature rise distribution graph of the PCB 4 can be used to detect if there are areas of the PCB 4 where the temperature is excessive. The detailed descriptions for plotting the temperature rise distribution graph of the PCB 4 are provided below.

The loading module 113 loads a current density distribution graph of the PCB 4 from the storage system 12. The current density of the PCB 4 is the quotient of the amount of current passing through the copper foil of the PCB 4 and the cross-sectional area of the copper foil. When the current density distribution of the PCB 4 is analyzed using a current analysis tool or a voltage analysis tool, the current density distribution graph can be output and stored in the storage system 12 when the designing of the PCB 4 is completed.

The plotting module 114 plots the temperature rise distribution graph of the PCB 4 according to the current density distribution graph and the temperature rise formula, and outputs the temperature rise distribution graph of the PCB 4 to the output device 3.

Figure 4:
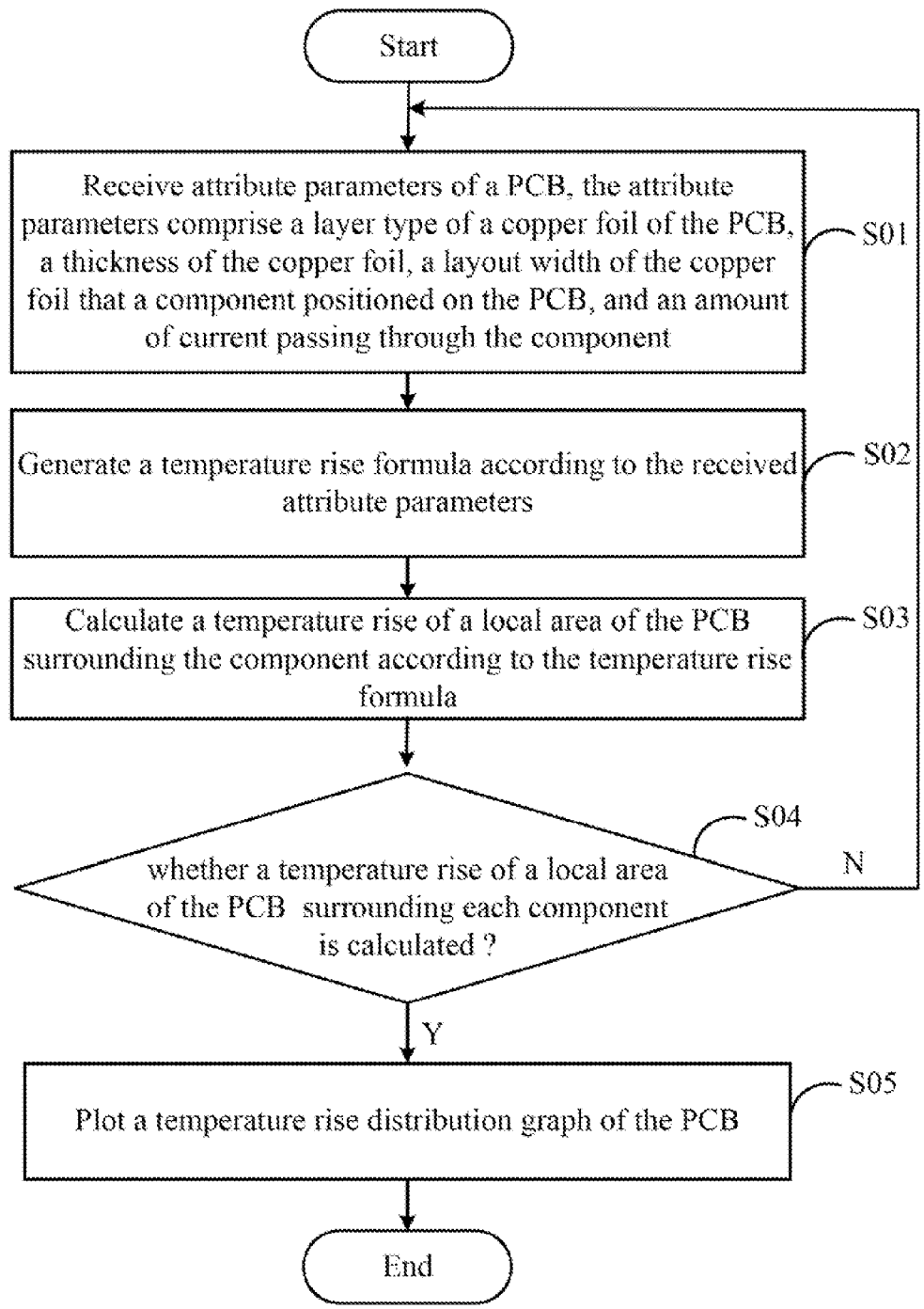
FIG. 4 is a flowchart of one embodiment of a method for analyzing a temperature rise of the PCB.

FIG. 4 is a flowchart of one embodiment of a method for analyzing temperature rise of the PCB 4 using a system, for example, that of FIG. 1. Depending on the embodiment, additional blocks may be added, others removed, and the ordering of the blocks, may be changed.

In block S01, The receiving module 110 receives attribute parameters of the PCB 4 from the input device 2. In one embodiment, the attribute parameters may comprise a layer type of a copper foil of the PCB 4, a thickness of the copper foil, a layout width of the copper foil for a component (e.g., resistor, capacitor, integrated circuit) positioned on the PCB 4, and an amount of current passing through the component. The layer type of the copper foil may be an internal layer or an external layer of the PCB 4.

In block S02, the generation module 111 generates a temperature rise formula according to the received attribute parameters. One example of the temperature rise formula is mentioned above. The parameters a, α and β of the temperature rise formula correspond to and are determined by the thickness of the copper foil and the layer type of the copper foil. And the parameters a, α and β are values stored in the storage system 12. Each copper foil having a different thickness and a different layer type corresponds to a unique temperature rise formula.

In block S03, the calculation module 112 calculates a temperature rise of a local area surrounding the component according to the generated temperature rise formula.

In block S04, the calculation module 112 determines whether a temperature rise of a local area surrounding each component of the PCB 4 is calculated. If the temperature rise of the local area surrounding each component is calculated, block S05 is implemented. Otherwise, if a temperature rise of the local area surrounding each component is not calculated, the block S01 is repeated until the temperature rise of a local area surrounding each component on the PCB 4 is calculated.

In block S05, after the temperature rise of the local area surrounding each component of the PCB 4 is calculated, the temperature rise analysis system 11 plots a temperature rise distribution graph of the PCB 4. The temperature rise distribution graph of the PCB 4 can be used to detect if there are areas where the temperature rise is excessive. The detailed descriptions for plotting the temperature rise distribution graph of the PCB 4 are provided below.

Figure 5:
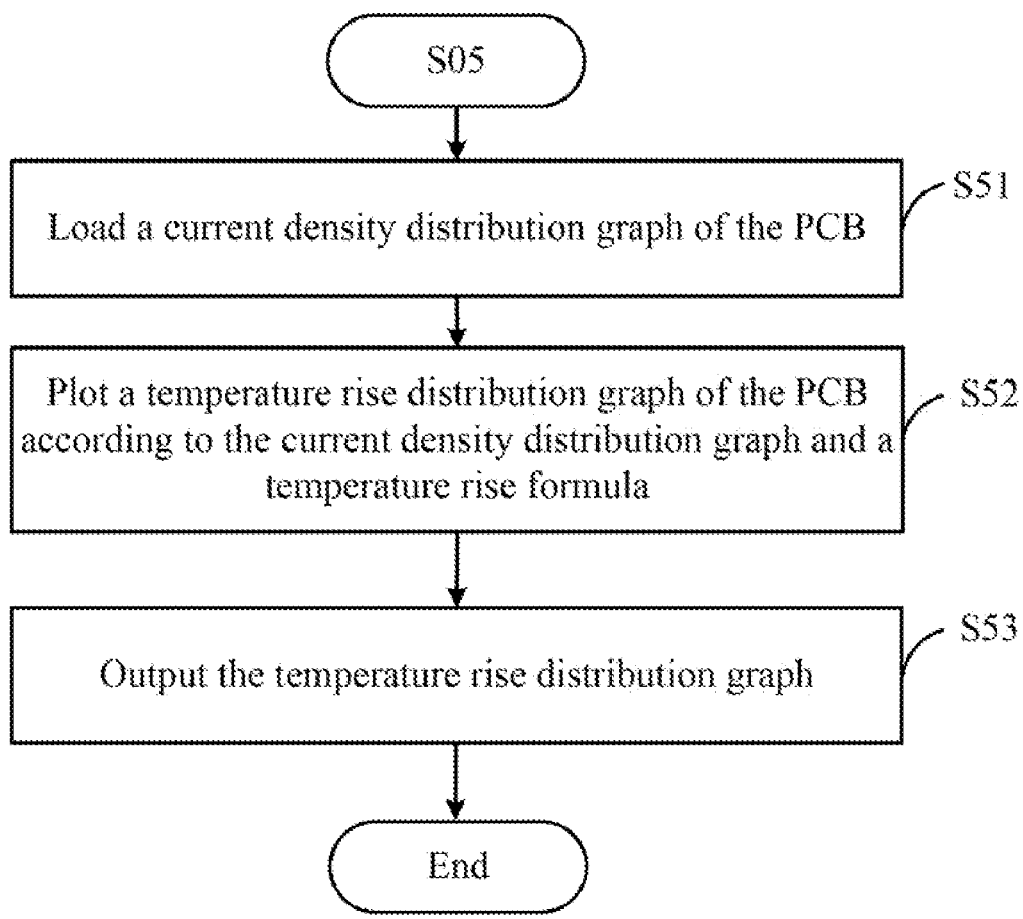
FIG. 5 is a flowchart of one embodiment of a block S05 in FIG. 4.

As shown in FIG. 5, is a flowchart of one embodiment of the block S05 in FIG. 4. In block S51, the loading module 113 loads a current density distribution graph of the PCB 4 from the storage system 12. The current density of the PCB 4 is the quotient of the amount of current passing through the copper foil of the PCB 4 and the cross-sectional area of the copper foil. When the current density distribution of the PCB 4 is analyzed using a current analysis tool or a voltage analysis tool, the current density distribution graph can be output and stored in the storage system 12 when the designing of the PCB 4 is completed.

In block S52, the plotting module 114 plots a temperature rise distribution graph of the PCB 4 according to the current density distribution graph and the temperature rise formula.

In block S53, the plotting module 114 outputs the temperature rise distribution graph of the PCB 4 to the output device 3.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computerized method being executed by a processor of a computing device, the method comprising:
   (a1) receiving attribute parameters of a printed circuit board (PCB) from an input device, the attribute parameters comprising a layer type of a copper foil of the PCB, a thickness of the copper foil, a layout width of the copper foil for a component positioned on the PCB, and an amount of current passing through the component;
   (a2) generating, using the processor, a temperature rise formula according to the received attribute parameters of the PCB, wherein the temperature rise formula is $I=a*S^{\alpha}*(\Delta T)^{\beta}$, I is the amount of current passing through the component, S is a product of the thickness of the copper foil and the layout width of the copper foil for the component positioned on the PCB, $\Delta T$ is the temperature rise of the local area surrounding the component, and a, α, and β correspond to and are determined by the thickness of the copper foil and the layer type of the copper foil, and a, α and β are values stored in a storage system;
   (a3) calculating, using the processor, a temperature rise of a local area of the PCB surrounding the component according to the generated temperature rise formula; and
   (a4) plotting a temperature rise distribution graph of the PCB on a display of the computing device when temperature rises of all components positioned on the PCB are calculated.

2. The method according to claim 1, wherein the layer type of the copper foil is an internal layer or an external layer.

3. The method according to claim 1, wherein block (a4) comprises:
   loading a current density distribution graph of the PCB from the storage system;
   plotting the temperature rise distribution graph of the PCB according to the current density distribution graph and the temperature rise formula; and
   outputting the temperature rise distribution graph to an output device.

4. The method according to claim 3, wherein the current density distribution graph is output by a current analysis tool or a voltage analysis tool when the current analysis tool or the voltage analysis tool analyzes the current density distribution of the PCB, and the current density distribution graph is stored in the storage system.

5. A computer system for analyzing temperature rise of a printed circuit board (PCB), the computer system comprising:
- a storage system;
- at least one processor; and
- one or more programs stored in the storage system and being executable by the at least one processor, the one or more programs comprising:
- a receiving module operable to receive attribute parameters of the PCB from an input device, the attribute parameters comprising a layer type of a copper foil of the PCB, a thickness of the copper foil, a layout width of the copper foil for a component positioned on the PCB, and an amount of current passing through the component;
- a generation module operable to generate a temperature rise formula according to the received attribute parameters of the PCB, wherein the temperature rise formula is $I=a*S^{\alpha}*(\Delta T)^{\beta}$, I is the amount of current passing through the component, S is a product of the thickness of the copper foil and the layout width of the copper foil for the component positioned on the PCB, $\Delta T$ is the temperature rise of the local area surrounding the component, and a, $\alpha$, and $\beta$ correspond to and are determined by the thickness of the copper foil and the layer type of the copper foil, and a, $\alpha$ and $\beta$ are values stored in a storage system; and
- a calculation module operable to calculate a temperature rise of a local area of the PCB surrounding the component according to the generated temperature rise formula.

6. The computer system according to claim 5, wherein the layer type of the copper foil is an internal layer or an external layer.

7. The computer system according to claim 5, further comprising:
- a loading module operable to load a current density distribution graph of the PCB from the storage system; and
- a plotting module operable to plot a temperature rise distribution graph of the PCB according to the current density distribution graph and the temperature rise formula, and output the temperature rise distribution graph to an output device.

8. The computer system according to claim 7, wherein the current density distribution graph is output by a current analysis tool or a voltage analysis tool when the current analysis tool or the voltage analysis tool analyzes the current density distribution of the PCB, and the current density distribution graph is stored in the storage system.

9. A storage medium storing a set of instructions, the set of instructions capable of being executed by a processor to perform a computerized method for analyzing temperature rise of a printed circuit board (PCB), the method comprising:
- (a1) receiving attribute parameters of the PCB from an input device, the attribute parameters comprising a layer type of a copper foil of the PCB, a thickness of the copper foil, a layout width of the copper foil for a component positioned on the PCB, and an amount of current passing through the component;
- (a2) generating a temperature rise formula according to the received attribute parameters of the PCB, wherein the temperature rise formula is $I=a*S^{\alpha}*(\Delta T)^{\beta}$, is the amount of current passing through the component, S is a product of the thickness of the copper foil and the layout width of the copper foil for the component positioned on the PCB, $\Delta T$ is the temperature rise of the local area surrounding the component, and a, $\alpha$, and $\beta$ correspond to and are determined by the thickness of the copper foil and the layer type of the copper foil, and a, $\alpha$ and $\beta$ are values stored in the storage medium;
- (a3) calculating a temperature rise of a local area of the PCB surrounding the component according to the generated temperature rise formula; and
- (a4) plotting a temperature rise distribution graph of the PCB when temperature rises of all components positioned on the PCB are calculated.

10. The storage medium as claimed in claim 9, wherein the layer type of the copper foil is an internal layer or an external layer.

11. The storage medium as claimed in claim 9, wherein block (a4) comprises:
- loading a current density distribution graph of the PCB from the storage medium; and
- plotting a temperature rise distribution graph of the PCB according to the current density distribution graph and the temperature rise formula; and
- outputting the temperature rise distribution graph to an output device.

12. The storage medium as claimed in claim 11, wherein the current density distribution graph is output by a current analysis tool or a voltage analysis tool when the current analysis tool or the voltage analysis tool analyzes the current density distribution of the PCB, and the current density distribution graph is stored in the storage medium.

* * * * *